United States Patent [19]

Salem

[11] Patent Number: 5,070,446

[45] Date of Patent: Dec. 3, 1991

[54] METHOD OF SIMULATING A HEXAGONAL ARRAY OF COMPUTER PROCESSORS AND/OR MEMORIES

[75] Inventor: James B. Salem, Boston, Mass.

[73] Assignee: Thinking Machines Corporation, Cambridge, Mass.

[21] Appl. No.: 654,410

[22] Filed: Feb. 8, 1991

Related U.S. Application Data

[63] Continuation of Ser. No. 275,694, Nov. 13, 1988, abandoned, which is a continuation of Ser. No. 825,510, Feb. 3, 1986, abandoned.

[51] Int. Cl.$^5$ .................. G06F 15/16; G06F 15/76; G06F 15/80
[52] U.S. Cl. .................. 395/500; 364/231.9; 364/232.3.DIG. 1
[58] Field of Search ... 364/200 MS File, 900 MS File

[56] References Cited

U.S. PATENT DOCUMENTS

| | | | |
|---|---|---|---|
| 4,247,892 | 1/1981 | Lawrence | 364/200 |
| 4,270,170 | 5/1981 | Reddaway | 364/200 |
| 4,493,048 | 1/1985 | Kung et al. | 364/724 |
| 4,498,133 | 2/1985 | Bolton et al. | 364/200 |
| 4,514,807 | 4/1985 | Nogi | 364/200 |
| 4,621,339 | 11/1986 | Wagner et al. | 364/490 X |
| 4,633,431 | 12/1986 | Bar | 364/900 |
| 4,644,496 | 2/1987 | Andrews | 364/900 |

OTHER PUBLICATIONS

IEEE Transactions on Computers, vol. C-26, No. 5, "The Indirect Binary n-Cube Microprocessor Array" written by M. Pease, III, May 1977, pp. 458-473.

Primary Examiner—Eddie P. Chan
Attorney, Agent, or Firm—Pennie & Edmonds

[57] ABSTRACT

A method is described for simulating a hexagonal array of computer processors or memories in a computer in which the processor and/or memories are physically connected in a rectilinear grid. The grid provides for communication between adjacent processors in both the horizontal and vertical directions. Thus, it provides physical connections between each processor and four nearest neighbor processors. Each processor is provided with two additional nearest neighbor processors by providing communication between each processor of the array and two additional adjacent processors located on different diagonals in the array. As a result of this arrangement the two additional processors are located either in the same column but in different rows adjacent to the row in which the neighboring processor is located or they are in the same row but in different columns adjacent to the column in which the neighboring processor is located. These additional communication patterns for all the processors add to the rectilinear array a zig zag communication pattern running through the array in either the vertical or horizontal direction.

5 Claims, 2 Drawing Sheets

METHOD OF SIMULATING A HEXAGONAL ARRAY OF COMPUTER PROCESSORS AND/OR MEMORIES

This is a continuation of application Ser. No. 07/275,694, filed Nov. 23, 1988 which is a continuation of Ser. No. 06/825,510, filed Feb. 3, 1986, both are now abandoned.

CROSS REFERENCE TO RELATED APPLICATIONS

Related applications are "Parallel Processor", Ser. No. 499,474 now U.S. Pat. No. 4,814,973 and "Parallel Processor/Memory Circuit", Ser. No. 499,471, now U.S. Pat. No. 4,709,327 both filed May 31, 1983, "Method and Apparatus for Routing Message Packets", Ser. No. 671,835, filed Nov. 15, 1984 now U.S. Pat. No. 4,598,400, "Method and Apparatus for Interconnecting Processors in a Hyper-Dimensional Array", Ser. No. 740,943, filed May 31, 1985, now abandoned and "Method and Apparatus for Simulating Systems Described by Partial Differential Equations", Ser. No. 814,348, filed Dec. 27, 1985, now U.S. Pat. No. 4,809,202 all of which are incorporated herein by reference.

BACKGROUND OF THE INVENTION

This relates to a method of simulating a hexagonal array of computer processors and/or memories and in particular to a method of simulating such arrays in a computer in which individual processors and/or memories are physically connected in a rectilinear grid.

Computer memories are typically organized in serial order at consecutive memory addresses or locations. The physical location of the memories usually is in the same numerical order as their addresses.

In parallel computers, processors are sometimes organized in a rectilinear array in which each processor is physically connected to adjacent processors in the same row and column. Thus each processor is connected to its nearest neighbor processors to the north, east, south and west. In the Connection Machine (Reg. TM) Computer that is described in the above referenced '474 application, each processor in an array of thousands of processors has its own memory and each processor/memory is connected in two different networks, one of which is a rectilinear array.

In certain applications it is desirable to interconnect processors and/or memories in more complicated networks than a rectilinear array. For example, as set forth in the above referenced application, "Method and Apparatus for Simulating Systems Described by Partial Differential Equations", it has been found possible to use cellular automata to simulate systems described by partial differential equations. In a preferred embodiment of that invention a two dimensional space is tesselated into a cellular array of regular hexagons and the simulation is performed by considering interactions between each hexagonal cell and its six nearest neighbors. To facilitate such simulation, it is desirable to represent each cell as a memory location and/or processing element that interacts with six nearest neighbors. Because of the enormous number of identical calculations that are required to perform the simulations described in "Method and Apparatus for Simulating Systems Described by Partial Differential Equations", it is also desirable to perform such calculations on a massively parallel processor such as the Connection Machine Computer. In that computer, however, as in many other parallel computers, individual processors are connected in a rectilinear array and not in a hexagonal array.

SUMMARY OF THE INVENTION

I have discovered a method of simulating a hexagonal array of computer processors or memories in a computer in which the processor and/or memories are physically connected in a rectilinear grid.

The grid provides for communication between adjacent processors in both the horizontal and vertical directions. Thus, it provides physical connections between each processor and four nearest neighbor processors. In accordance with my invention, each processor is provided with two additional nearest neighbor processors by providing communication between each processor of the array and two additional adjacent processors located on different diagonals in the array. As a result of this arrangement the two additional processors are located either in the same column but in different rows adjacent to the row in which the neighboring processor is located or they are in the same row but in different columns adjacent to the column in which the neighboring processor is located. These additional communication patterns for all the processors add to the rectilinear array a zig zag communication pattern running through the array in either the vertical or horizontal direction.

BRIEF DESCRIPTION OF DRAWINGS

These and other objects, features and advantages of the invention will be more readily apparent from the following detailed description of the preferred embodiment of the invention in which.

DETAILED DESCRIPTION OF THE PREFERRED EMBODIMENT

The present invention is intended to be implemented in a massively parallel single instruction multiple data (SIMD) computer such as the Connection Machine Computer described in detail in application Ser. No. 499,474.

Figure 1:
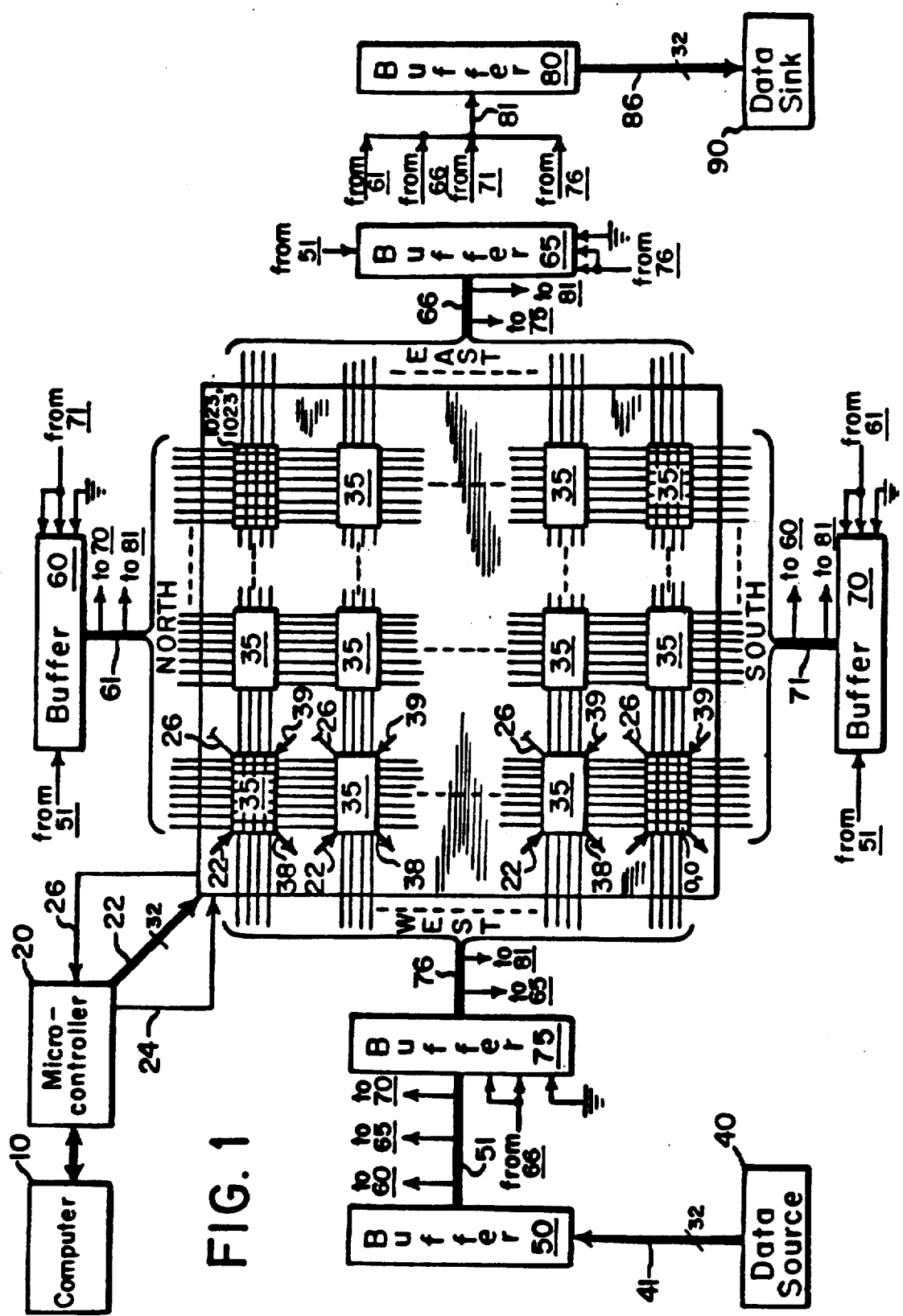
FIG. 1 is a schematic illustration of a Connection Machine Computer that depicts the rectilinear array of processor/memories in which the invention may be practiced.

As shown in FIG. 1A of that application which is reproduced in FIG. 1, the computer system comprises a mainframe computer 10, a microcontroller 20, an array 30 of parallel processing integrated circuits 35, a data source 40, a first buffer and multiplexer/demultiplexer 50, first, second, third and fourth bidirectional bus control circuits 60, 65, 70, 75, a second buffer and multiplexer/demultiplexer 80, and a data sink 90. Mainframe computer 10 may be a suitably programmed commercially available general purpose computer such as a VAX (TM) computer manufactured by Digital Equipment Corp. Microcontroller 20 is an instruction sequencer of conventional design for generating a sequence of instructions that are applied to array 30 by means of a thirty-two bit parallel bus 22. Microcontroller 20 receives from array 30 a signal on line 26. This signal is a general purpose or GLOBAL signal that can be used for data output and status information. Bus 22 and line 26 are connected in parallel to each IC 35. As a result, signals from microcontroller 20 are applied simultaneously to each IC 35 in array 30 and the signal applied to microcontroller 20 on line 26 is formed by combining the signal outputs from all of ICs 35 of the array.

In the embodiment of the Connection Machine Computer used in the practice of the present invention, array 30 contains 2048 ($=2^{11}$) identical ICs 35; and each IC 35 contains 16 ($=2^4$) identical processor/memories 36. Thus, the entire array 30 contains 32,768 ($=2^{15}$) identical processor/memories 36.

Processor/memories 36 are organized and interconnected in two geometries. The geometry of interest to the present invention is a conventional two-dimensional grid pattern in which the processor/memories are organized in a rectangular array of 128×256 processor/memories and connected to their four nearest neighbors in the array. For convenience, the sides of this array are identified as NORTH, EAST, SOUTH and WEST.

To connect each processor/memory to its four nearest neighbors, the individual processor/memories are connected by electrical conductors between adjacent processor/memories in each row and each column of the grid as shown in FIGS. 6A and 7A of the '474 application; and the four nearest neighbors of an IC except those on the edges of the array will be recognized to be the four ICs immediately adjacent that IC on the North, East, South and West.

Figure 2:
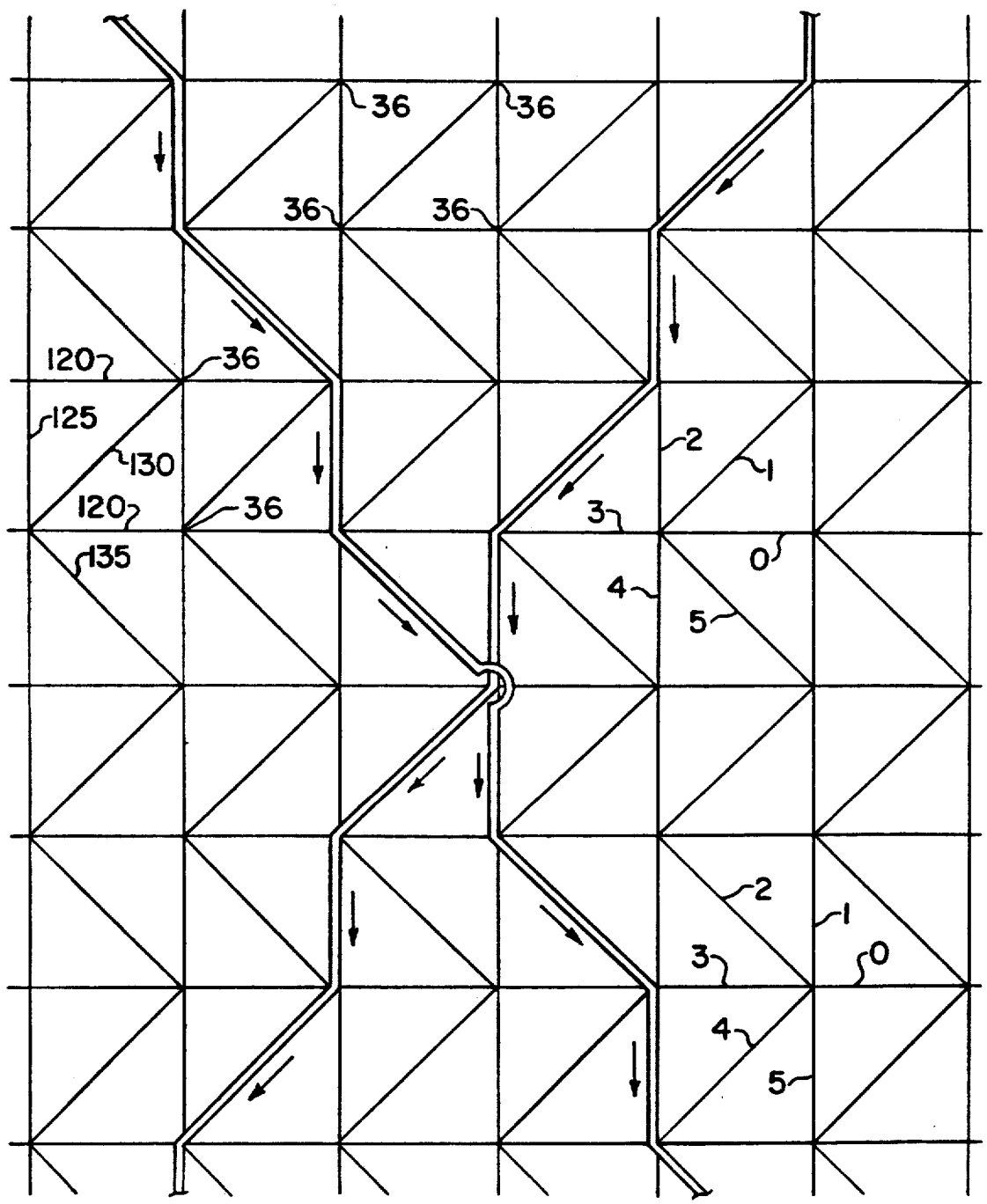
FIG. 2 is a schematic illustration depicting the connection pattern of processor/memories in accordance with the invention.

The rectilinear array of processor/memories 36 is schematically illustrated in FIG. 2. As shown therein the processor/memories 36 are interconnected by horizontal and vertical lines 120, 125, respectively. The horizontal lines represent the EAST and WEST connections between adjacent processor/memories in the rectilinear grid of the Connection Machine Computer and the vertical lines represent the NORTH and SOUTH connections between adjacent processor/memories. These connections are implemented in the form of physical wires between the adjacent processor/memories in the rectilinear grid.

As indicated in "A Method and Apparatus for Simulating Systems Described by Partial Differential Equations", it sometimes is desirable to interconnect processors and/or memories in a more complicated network than a rectilinear array. Of particular interest is the need to provide for interaction between each processor/memory and six neighboring processors so as to simulate a two dimensional space that has been tesselated into a cellular array of regular hexagons.

In accordance with the invention, this is accomplished by connecting each processor/memory to two other neighboring processor/memories along two different diagonals 130, 135 of the grid. In the embodiment shown in FIG. 2, the same connection pattern is applied uniformly to all the processor/memories on the odd rows of the grid. As will be apparent this also defines the connection pattern for the processor/memories on the interlineated even rows. As a result, this connection pattern zig-zags down the columns of the grid. Alternatively, the same connection pattern could be applied uniformly to all the processor/memories on the odd colums of the grid in which case the pattern would zig-zag along the rows of the grid.

The zig-zag connection pattern is not implemented by physical wires between processor/memories. Rather, it is implemented in the computer in software so that the computer shifts data diagonally from a source to a destination by first shifting the data from a source processor/memory to the adjacent processor/memory in either the horizontal or vertical direction and then shifting the data in the other rectilinear direction to the destination processor/memory.

In providing six nearest neighbors for each processor/memory, the zig-zag pattern of FIG. 2 supports movement of data along three axes spaced 60 degrees apart from each other in a pattern characteristic of a hexagonal grid. This is achieved by defining the axes of the grid as: (1) the horizontal or EAST-WEST connections; (2) a succession of alternating vertical and diagonal connections running from the upper left to lower right of the grid and (3) a succession of alternating vertical and diagonal connections running from the upper right to the lower left. As shown in FIG. 2, the rate of movement along such diagonal axes is exactly the same as in a hexagonal array, namely two cells up or down for each cell to the right or left.

This definition of axes can also be related to the six faces 0-5 of the hexagon as shown in FIG. 2. In the case of an even row, faces 0 and 3 are on the EAST-WEST axis; faces 1 and 4 are on the same axis even though face 1 is associated with the diagonal to the upper right and face 4 is associated with the downward vertical; and faces 2 and 5 are on the same axis even though face 2 is associated with the upward vertical and face 5 with the diagonal to the lower right. In the case of an odd row, faces 0 and 3 are again on the EAST-WEST axis; faces 1 and 4 are on the same axis even though face 1 is associated with the upward vertical and face 4 is associated with the diagonal to the lower left; and faces 2 and 5 are on the same axis even though face 2 is associated with the diagonal to the upper left and face 5 is associated with the downward vertical.

In the event the zig-zag pattern runs along the rows, the three axes are defined as: (1) the vertical or NORTH-SOUTH connections; (2) a succession of alternating horizontal and diagonal connections running from upper left to the bottom right; and (3) a succession of alternating horizontal and diagonal connections running from the upper right to the bottom left.

To implement the hexagonal simulation in the rectilinear array of processor/memories, it is necessary to understand the way in which the processor/memories are organized in the array. Each processor/memory has an address. Illustratively, these addresses are assigned in consecutive number order in a raster pattern starting with the cell in the upper left hand corner of the two-dimensional space, followed by the cell immediately to its right on the horizontal or 0-axis, and so forth to the upper right hand corner, then to the cell on the left hand side on the row immediately below the first row, the cell immediately to its right and so forth to the cell on the bottom row at the lower right hand corner of the array. Thus, in the case of the 256×128 array of processor/memories, the relative addresses assigned to the processors in the upper left hand corner of the array are:

TABLE I

| 0000 | 0001 | 0002 | 0003 | ... |
| 0256 | 0257 | 0258 | 0259 | ... |
| 0512 | 0513 | 0514 | 0515 | ... |
| 0768 | 0769 | 0770 | 0771 | ... |
| 1024 | 1025 | 1026 | 1027 | ... |
| ... | ... | ... | ... | ... |

Consistent with the illustration of FIG. 2, for a processor/memory in an even row, the six nearest neighbor processor/memories are those immediately to the left and right of the processor/memory on the same row and those immediately above and below it in the same column and the two processor/memories in the column to the right and in the immediately adjacent rows. For a processor/memory in an odd row, the six nearest neighbor processor/memories are those immediately to the left and right of the processor/memory on the same row and those immediately above and below it in the same column and the two processor/memories in the column to the left and in the immediately adjacent rows.

Accordingly, if y is the number of memory addresses per row in the rectilinear array (256 in the example of Table I) and x is the difference in adjacent memory addresses (1 in the example of Table I), the distances to the nearest neighbor processor/memories for a processor/memory (proc/mem) in an even row are given by:

TABLE II

|     | $-y$     | $-y+x$   |      |
|-----|----------|----------|------|
| $-x$| proc/mem |          | $+x$;|
|     | $+y$     | $+y+x$   |      |

Similarly, the distances to the nearest neighbor cells for a cell in an odd row are given by:

TABLE III

|     | $-y-x$   | $-y$   |      |
|-----|----------|--------|------|
| $-x$| proc/mem |        | $+x$.|
|     | $+y-x$   | $+y$   |      |

If the even rows are offset to the left of the odd rows, instead of to the right as assumed in FIG. 2, then Table II will depict the distances between cells for a cell in an odd row and Table III the distances between cells for a cell in an even row.

A computer program for shifting data in this fashion so as to simulate a hexagonal array is attached hereto as Appendix I. The program is written in Common LISP (as described in Steele, Guy, *Common LISP: The Language*, Digital Press, Burlington, Mass. (1984)). The coordinates in memory of the nearest neighbor cells are defined by the function CELL-NEIGHBOR-LOCATION. This function, for example, specifies that the coordinates of the nearest neighbor cell to the right of the cell at memory location x,y are obtained by incrementing x by one. Likewise, the coordinates of the nearest neighbor cell to the upper right are obtained by decrementing y and if y is even (i.e., the cell is in an even row) incrementing x. As will be apparent, this function implements the relationships set forth in Tables II and III.

The present invention is also compatible with another feature of the Connection Machine Computer: its ability to subdivide each processor memory into several units that function identically. In effect, each unit operates as a separate processor/memory (known as a virtual processor) sharing the RAM, ALU and flag controller of one physical processor/memory. The subdivision of one physical processor/memory into several is accomplished by partitioning the memory in each physical processor/memory in the same fashion and providing in microcontroller 20 of FIG. 1 the capacity of having each physical processor memory operate first on one portion of the partitioned memory, then on the next portion of the partitioned memory and so on through each cell value stored in the memory.

As will be apparent to those skilled in the art, numerous modifications may be made within the scope of the above described invention.

```
;;; -*- Mode: LISP; Syntax: Common-Lisp ; Base: 10; Package: COMMON-LISP-USER -*-
;;;***********************************************************************
;;; For hexagonal turbulence
;;; Each cell has 6 bits -- direction particle is moving
;;;
;;;             R UR UL L  DL DR  |  R= Right L= Left D= Down U= Up
;;; direction  0 1  2  3  4  5
;;;
;;; we encode this in the real news grid by having
;;; R = east   UR = north (y even), northeast (y odd)  UL = northwest (y even), up (y odd)
;;; L = west   DL = southwest (y even), south (y odd)  DR = south (y even), southeast (y odd)
;;;
;;;           Y ODD                    Y EVEN
;;;         UL---UR                  UL---UR
;;;           |                        |
;;;           |                        |
;;;         L ------ R              L ------ R
;;;           |                        |
;;;           |                        |
;;;         DL---DR                  DL---DR
;;;
;;; This gives us a rectangular section of a hexagonal lattice
;;; The east-west axis is corresponds to the horizontal axis of the hexagonal lattice
;;;
;;; In the CM 2D news grid DOWN is in the positive Y direction and RIGHT is in the positive X
;;; direction
;;;
;;; It is sometimes useful to think about the axes
;;; AXIS 0 is the horizonal axis
;;; AXIS 1 goes from UR to DL
;;; AXIS 2 goes from UL to DR
```

```
;;; Hexagonal Interactions [implemented by INTERACT-CELL]
;;; There are 4 types
;;;   1) Two way interactions where net momentum is zero (3 varieties)
;;;   2) Four way interactions where net momentum is zero (3 varieties)
;;;   3) Three way symmetric interactions where net momentum is zero (2 varieties)
;;;   4) Three way interactions where two of the particles interact head on (12 varieties)

;;; Reflection Rules : [implemented by REFLECT-CELL]
;;; "Bounce Back" Reflectance :
;;; When a particle enters a reflective cell (i.e. where REFLECT-CONFIG is 1) then the particle
;;; bounces back and moves in the opposite direction.

;;; "Specular" Reflectance
;;; When a particle enters a reflective cell (i.e. where REFLECT-CONFIG is 1)  then the particle
;;; if is reflected through an angle of two times the angle of incidence with the surface.  This
;;; is the same as the reflection of rays light from a mirror.

;;; Primitive Functions used by the following code :
;;;  (CONFIG-CELL config x y) returns the value of the configuration CONFIG at location (X,Y)
;;;  as a fixnum
```

APPENDIX I

```
;;; Definition of Directions
(defconstant *tr*  0)
(defconstant *tur* 1)
(defconstant *tul* 2)
(defconstant *tl*  3)
(defconstant *tdl* 4)
(defconstant *tdr* 5)

;;; Masks used to select particular directions within a cell value (defconstant *tr-mask*  1)
(defconstant *tur-mask* 2)
(defconstant *tul-mask* 4)
(defconstant *tl-mask*  8)
(defconstant *tdl-mask* 16)
(defconstant *tdr-mask* 32)

;;; Masks particles along a particular axis
(defconstant *axis-0-mask* (logior *tr-mask* *tl-mask*))
    (defconstant *axis-1-mask* (logior *tur-mask* *tdl-mask*))
    (defconstant *axis-2-mask* (logior *tul-mask* *tdr-mask*))

;;; Masks all bits
(defconstant *cell-mask*  63.)

;;; Reflection Rules
;;;                          Entry direction :::   *tr* *tur* *tul* *tl* *tdl* *tdr*
(defconstant *bounce-back-reflectance*         '(*tl* *tdl* *tdr* *tr* *tur* *tul*))

;;; Specular reflectance off of horizontal surfaces
(defconstant *specular-reflectance-horizontal* '(*tl* *tdr* *tdl* *tr* *tul* *tur*))

;;; Specular reflectance off of vertical surfaces
(defconstant *specular-reflectance-vertical*   '(*tl* *tul* *tur* *tr* *tdr* *tdl*))

(defun CELL-NEIGHBOR-LOCATION (x y direction)
 "This implements the mapping of the Hexagonal Lattice onto the 2D news grid"
 "Returns the nearest xy news grid location to location X Y in direction DIRECTION"
 (declare (return-list new-x new-y))
 (case direction
   ;;; indexes to a particular case
   (*tr* (incf x))
   (*tur* (decf y)
           (if (evenp y) (incf x)))
   (*tul* (decf y)
           (if (oddp y) (decf x)))
   (*tl* (decf x))
   (*tdl* (incf y)
           (if (oddp y) (decf x)))
   (*tdr* (incf y)
           (if (evenp y) (incf x)))
   )
  (values x y))
```

```
(defun REFLECT-CELL (cell-value &optional (rule *BOUNCE-BACK-REFLECTANCE*)
                                ;; or *SPECULAR-REFLECTANCE-HORIZONTAL*
                                ;; or *SPECULAR-REFLECTANCE-VERTICAL*
                                )
  "This implements the reflection rule"
  (let ((old-direction-mask 1)
        new-direction-mask
        (new-value 0))

(dolist (new-direction rule)

(setq new-direction-mask (lsh 1 new-direction)) ;; Turns the direction (0 to 5) into a bit
                                                      ;; mask (0 to 32)
      (when (not (zerop (logand cell-value old-direction-mask)))
            (setq new-value (logior new-value new-direction-mask)))

(setq old-direction-mask (lsh old-direction-mask 1))
      )
    new-value))

(defun NEXT-CELL-STATE (config x y reflect-config)
  "Computes the next state of a particular cell"

(macrolet ((get-cell-value (x y)
                "This macro performs the reflection calculation"

`(let ((cell (config-cell config ,x ,y)))
                   (when (not (zerop (config-cell reflect-config ,x ,y)))
                     (setq cell (reflect-cell cell)))
                   cell)))

(let ((cell-value
            ;;; implements conservation of momentum
            ;;; particles moving in a particular direction move to the next cell in that
            ;;; direction and stay moving in that direction unless a interaction occurs (logior ;;; combine particles from each of the directions ;;; Get coordinate of cell to left
              (multiple-value-bind (new-x new-y) (cell-neighbor-location x y *tl*)
                ;;; pick out its right moving particle
                (logand (get-cell-value new-x new-y) *tr-mask*))

;;; Get coordinate of cell to right
              (multiple-value-bind (new-x new-y) (cell-neighbor-location x y *tr*)
                ;;; pick out its right moving particle
                (logand (get-cell-value new-x new-y) *tl-mask*))

;;; Get coordinate of cell to down left
              (multiple-value-bind (new-x new-y) (cell-neighbor-location x y *tdl*)
                ;;; pick out its right moving particle
                (logand (get-cell-value new-x new-y) *tur-mask*))

;;; Get coordinate of cell to up left
              (multiple-value-bind (new-x new-y) (cell-neighbor-location x y *tul*)

;;; pick out its right moving particle
                (logand (get-cell-value new-x new-y) *tdr-mask*))

;;; Get coordinate of cell to down right
              (multiple-value-bind (new-x new-y) (cell-neighbor-location x y *tdr*)

;;; pick out its right moving particle
                (logand (get-cell-value new-x new-y) *tul-mask*))

;;; Get coordinate of cell to up right
              (multiple-value-bind (new-x new-y) (cell-neighbor-location x y *tur*)

;;; pick out its right moving particle
                (logand (get-cell-value new-x new-y) *tdl-mask*)))))

(interact-cell cell-value))))
```

```
(defun INTERACT-CELL (cell-value)
  "Implements interaction rules. This implementation simply picks a random number to decide
which direction the particles should move in after the interaction"

(let* (;;; particles along a particular axis
         (axis-0 (logand *axis-0-mask* cell-value))
         (axis-1 (logand *axis-1-mask* cell-value))
         (axis-2 (logand *axis-2-mask* cell-value))

;;; number of particles along a particular
         (num-particles-on-axis-0 (logcount axis-0))
         (num-particles-on-axis-1 (logcount axis-1))
         (num-particles-on-axis-2 (logcount axis-2))

(total-particles
           (+ num-particles-on-axis-0 num-particles-on-axis-1 num-particles-on-axis-2))

;;; True if at one least one particle on each axis
         (particles-on-all-axes-p (not (or (zerop num-particles-on-axis-0)
                                           (zerop num-particles-on-axis-1)
                                           (zerop num-particles-on-axis-2))))

;;; True if particles on just one axis
         (particles-on-just-one-axis-p
           (and (not (zerop total-particles))
                (or (and (zerop num-particles-on-axis-0) (zerop num-particles-on-axis-1))
                    (and (zerop num-particles-on-axis-1) (zerop num-particles-on-axis-2))
                    (and (zerop num-particles-on-axis-2) (zerop num-particles-on-axis-0)))))
         )
    (cond (;;; 3-way-symmetric
           (or (= cell-value 21.) (= cell-value 42.))
           (if (zerop (random 2))
               (logxor cell-mask cell-value)
               cell-value))

(;;; 2-way and 4-way
           (or (and (= total-particles 2.) particles-on-just-one-axis-p)
               (and (= total-particles 4.) (not particles-on-all-axes-p)))

(let ((interaction-shift (random 3)))
             (logand cell-mask (logior (lsh cell-value interaction-shift)
                                       (lsh cell-value (- interaction-shift 6))))))

(;;; 3-way-asymmetric
           (and (= total-particles 3) (not particles-on-all-axes-p))
           (if (zerop (random 2))
               (logior (case num-particles-on-axis-0 (0 *axis-0-mask*) (1 axis-0) (2 0))
                       (case num-particles-on-axis-1 (0 *axis-1-mask*) (1 axis-1) (2 0))
                       (case num-particles-on-axis-2 (0 *axis-2-mask*) (1 axis-2) (2 0)))
               cell-value))

(t cell-value))))
```

What is claimed is:

1. In a computer in which a plurality of processors are physically interconnected in a rectilinear grid, a method of simulating a hexagonal array of processors having first, second and third axes in said grid, said first axis running in either the horizontal or the vertical direction in said grid, the second axis running generally from the upper left to the bottom right of the grid in a first zig-zag pattern between processors in the grid and the third axis running generally from the upper right to the bottom left of the grid in a second zig-zag pattern between processors in the grid, each zig-zag pattern comprising a succession of two alternating elements one of which is a diagonal element extending between processors in two adjacent rows and two adjacent columns of the grid and the other of which is a vertical or horizontal element perpendicular to the first axis and extending between processors in adjacent rows or columns of the grid, said method comprising the steps of:

defining in computer code a relationship between each processor and six other processors, a first pair of said other processors being located on opposite sides of said processor on the first axis, a second pair of said other processors being located on opposite sides of said processor on the second axis, and a third pair of said other processors being located on opposite sides of said processor on the third axis;

executing said computer code to determine for each processor its six nearest neighbor processors and to provide:

communication between each processor and the first pair of processors located on opposite sides of said processor on the first axis in said rectilinear grid;

communication between each processor and the second pair of processors located on opposite sides of said processor on the second axis in said rectilinear grid; and communication between each processor and the third pair of processors located on opposite sides of said processor on the third axis in said rectilinear grid;

whereby communication is provided between each processor and six nearest neighbor processors on said first, second and third axes in the rectilinear grid.

2. In a computer in which a plurality of processors are physically interconnected in a rectilinear grid, apparatus for simulating a hexagonal array of processors having first, second and third axes in said grid, said first axis running in either the horizontal or the vertical direction in said grid, the second axis running generally from the upper left to the bottom right of the grid in a first zig-zag pattern between processors in the grid and the third axis running generally from the upper right to the bottom left of the grid in a second zig-zag pattern between processors in the grid, each zig-zag pattern comprising a succession of two alternating elements one of which is a diagonal element extending between processors in two adjacent rows and two adjacent columns of the grid and the other of which is a vertical or horizontal element perpendicular to the first axis and extending between processors in adjacent rows or columns of the grid, said apparatus comprising:

means for defining in computer code a relationship between each processor and six other processors, a first pair of said other processors being located on opposite sides of said processor on the first axis, a second pair of said other processors being located on opposite sides of said processor on the second axis, and a third pair of said other processors being located on opposite sides of said processor on the third axis, means for executing said computer code to determine for each processor its six nearest neighbors and to provide:

communication between each processor and the first pair of processors located on opposite sides of said processor on the first axis in said rectilinear grid;

communication between each processor and the second pair of processors located on opposite sides of said processor on the second axis in said rectilinear grid; and communication between each processor and the third pair of processors located on opposite sides of said processor on the third axis in said rectilinear grid;

whereby communication is provided between each processor and six nearest neighbor processors on said first, second and third axes in the rectilinear grid.

3. A method of simulating a hexagonal array of computer processors in a computer in which a plurality of processors are physically connected in a rectilinear grid, said method comprising the steps of:

for each processor in the rectilinear grid except those at the edges of the grid, defining in computer code six nearest neighbor processors, first and second nearest neighbor processors being located adjacent to and on either side of said processor in a row in said rectilinear grid, third and fourth nearest neighbor processors being located adjacent to and on either side of said processor in a column in said rectilinear grid, and the fifth and sixth nearest neighbor processors being located in the same column adjacent to and on either side of the first nearest neighbor processor in alternating rows and being located adjacent to and on either side of the second nearest neighbor processor in the remaining rows;

for each processor in the rectilinear grid, executing said computer code to determine its six nearest neighbor processors and to communicate:

along a first axis in the grid between each said processor and said first and second nearest neighbor processors located on either side of said processor in a row in said rectilinear grid;

along a second axis in the grid at an angle to said first axis between said processor and one of its third and fourth nearest neighbor processors located on a first side of said first axis and one of its fifth and sixth nearest neighbor processors located on a second side of said first axis;

along a third axis in the grid at an angle to said first axis between said processor and the other of its third and fourth nearest neighbor processors and the other of its fifth and sixth nearest neighbor processors;

whereby communication is provided between each processor and six nearest neighbor processors in three directions defined in the rectilinear grid.

4. A method of simulating a hexagonal array of computer processors in a computer in which a plurality of processors are physically connected in a rectilinear grid, said method comprising the steps of:

for each processor in the rectilinear grid except those at the edges of the grid, defining in computer code six nearest neighbor processors, first and second nearest neighbor processors being located adjacent to and on either side of said processor in a row in said rectilinear grid, third and fourth nearest neighbor processors being located adjacent to and on either side of said processor in a column in said rectilinear grid, and the fifth and sixth nearest neighbor processors being located in the same row adjacent to and on either side of the third nearest neighbor processor in alternate columns and being located adjacent to and on either side of the fourth nearest neighbor processor in the remaining columns;

for each processor in the rectilinear grid, executing said computer code to determine its six nearest neighbor processors and to communicate:

along a first axis in the grid between each said processor and said third and fourth nearest neighbor processors located on either side of said processor in a column in said rectilinear grid;

along a second axis in the grid at an angle to said first axis between said processor and one of its first and second nearest neighbor processors located on a first side of said first axis and one of its fifth and sixth nearest neighbor processors located on a second side of said first axis;

along a third axis in the grid at an angle to said first axis between said processor and the other of its first and second nearest neighbor processors and the other of its fifth and sixth nearest neighbor processors;

whereby communication is provided between each processor and six nearest neighbor processors in three directions defined in the rectilinear grid.

5. A method of simulating a hexagonal array of processors in a computer including a plurality of processors connected in a rectangular grid comprising the steps of:
A. defining in computer code, for each processor, six nearest neighbor processors including (i) a first pair of nearest neighbor processors on opposite sides of said processor along a first axis in said grid, (ii) a second pair of nearest neighbor processors on opposite sides of said processor along a second axis in said grid, and (iii) a third pair of nearest neighbor processors on opposite sides of one of the nearest neighbor processors of the first pair, the one being selected so that for adjacent processors along said second axis the nearest neighbor processors of said third pair are on alternate sides of said second axis;
B. for each processor in the rectilinear grid, executing said computer code to determine its six nearest neighbor processors and to communicate:
  1) in a first direction with said first pair of nearest neighbor processors along said first axis;
  2) in a second direction with one of the processors of said second pair and one of the processors of said third pair on opposite sides of said first axis; and
  3) in a third direction with the other of the processors of said second pair and the other of the processors of said third pair;
to thereby facilitate communication between each processor and six nearest neighbor processors along three directions as defined in said rectangular grid.

* * * * *